(12) United States Patent
Grafendorfer et al.

(10) Patent No.: US 9,726,737 B2
(45) Date of Patent: Aug. 8, 2017

(54) RADIO-FREQUENCY COIL ARRAYS AND METHODS OF ARRANGING THE SAME

(71) Applicant: General Electric Company, Scheneectady, NY (US)

(72) Inventors: Thomas Grafendorfer, Stanford, CA (US); Fraser Robb, Aurora, OH (US); Greig Scott, Palo Alto, CA (US); Shreyas Vasanawala, Standford, CA (US)

(73) Assignee: General Electric Company, Schenectady, NY (US)

( * ) Notice: Subject to any disclaimer, the term of this patent is extended or adjusted under 35 U.S.C. 154(b) by 648 days.

(21) Appl. No.: 14/261,885

(22) Filed: Apr. 25, 2014

(65) Prior Publication Data
US 2014/0300359 A1  Oct. 9, 2014

(51) Int. Cl.
*G01R 33/36* (2006.01)
*G01R 33/3415* (2006.01)

(52) U.S. Cl.
CPC ..... *G01R 33/3685* (2013.01); *G01R 33/3415* (2013.01)

(58) Field of Classification Search
CPC .......................... G01R 33/3685; G01R 33/3415
See application file for complete search history.

(56) References Cited

U.S. PATENT DOCUMENTS

| 5,543,713 | A | * | 8/1996 | Arakawa | H01F 17/02 324/318 |
|---|---|---|---|---|---|
| 6,177,797 | B1 | | 1/2001 | Srinivasan | |
| 7,599,729 | B2 | | 10/2009 | Atalar et al. | |
| 9,002,431 | B2 | | 4/2015 | Jones | |
| 2002/0169374 | A1 | * | 11/2002 | Jevtic | G01R 33/365 600/422 |
| 2011/0267061 | A1 | * | 11/2011 | Taracila | G01R 33/3685 324/322 |

* cited by examiner

*Primary Examiner* — Rodney Bonnette
(74) *Attorney, Agent, or Firm* — Dean D. Small; The Small Patent Law Group, LLC

(57) ABSTRACT

In accordance with various embodiments, a radio frequency (RF) coil array for use in a magnetic resonance imaging (MRI) system includes at least first and second RF coils. Each of the RF coils have a main body loop configured to at least one of transmit or receive RF energy at an operating imaging frequency in connection with acquiring MRI image data for an MRI system. The RF coil array also includes first and second cables configured to electrically couple the first and second RF coils, respectively, to a system interface. The RF coil array also includes a common ground connection between the first and second cables. The common ground connection is selectively positioned at a grounding point along lengths of the first and second cables to form a ground loop having a select self-resonance frequency (SRF) that differs from the imaging frequency of the MRI system.

20 Claims, 8 Drawing Sheets

RADIO-FREQUENCY COIL ARRAYS AND METHODS OF ARRANGING THE SAME

BACKGROUND

The subject matter disclosed herein relates generally to radio frequency (RF) coils, such as for use in Magnetic Resonance Imaging (MRI) systems.

MRI systems include a magnet, such as a superconducting magnet that generates a temporally constant (i.e., uniform and static) primary or main magnetic field. MRI data acquisition is accomplished by exciting magnetic moments within the primary magnetic field using radio-frequency (RF) coils. For example, in order to image a region of interest, magnetic gradient coils are energized to impose a magnetic gradient to the primary magnetic field. The RF coils are then pulsed to create RF magnetic field pulses in a bore of an MRI scanner and then used to acquire MRI image data of the region of interest. The MRI image data is used to generate images that show the structure and function of the region of interest.

In MRI systems, coaxial cables that couple the RF coils to components of the imagining system may cause interference with the operation of adjacent RF coils, by creating a cross coupling effect. Thus, when a plurality of RF coils are joined to form an RF coil array, the RF coil array often shows a degradation in performance once all of the coaxial cables are connected. In order to suppress or dampen the cross coupling effect, one or more balanced-unbalanced (baluns) are typically placed in series with the coaxial cables to reduce the effects of the cross coupling. However, to be effective, the baluns require precise placement at specific locations along the coaxial cables. Identifying the specific location along the cables for the baluns can be a process involving trial and error, which is time consuming and inefficient.

BRIEF DESCRIPTION

In accordance with various embodiments, a radio frequency (RF) coil array for use in a magnetic resonance imaging (MRI) system is provided. The RF coil array includes at least first and second RF coils. Each of the RF coils have a main body loop configured to at least one of transmit or receive RF energy at an operating imaging frequency in connection with acquiring MRI image data for an MRI system. The RF coil array also includes first and second cables configured to electrically couple the first and second RF coils, respectively, to a system interface. The RF coil array also includes a common ground connection between the first and second cables. The common ground connection is selectively positioned at a grounding point along lengths of the first and second cables to form a ground loop having a select self-resonance frequency (SRF) that differs from the imaging frequency of the MRI system.

In certain embodiments, the RF energy includes a wavelength, and the location of the grounding point is based on the wavelength.

In certain embodiments, the grounding point is located at a distance approximately one-fourth of the wavelength extending from the main body loop of at least one of the first or second RF coils.

In certain embodiments, the main body loops of the first and second RF coils each include a central portion extending approximately through a center of each respective main body loop. The first or second cables extend to and through the central portion of the respective main body loop.

In certain embodiments, the ground loop includes the first and second RF coils and the first and second cables. The select SRF of the ground loop is tuned by moving the grounding point along the lengths of the first and second cables.

In certain embodiments, the first and second cables include an impedance. The position of the grounding point along the length of the first and second cables is set to define a select impedance along the ground loop in connection with setting the select SRF.

In certain embodiments, the self-resonance frequency is less than the imaging frequency.

In certain embodiments, the imaging frequency is approximately 128 megahertz.

In certain embodiments, the first and second cables are arranged such that the first and second cables are approximately perpendicular to electric field lines generated by the main body loops of the first and second RF coils.

In certain embodiments, the first and second cables include an outer conductor, the outer conductors electrically coupled to one another to from the common ground connection.

In accordance with other embodiments, a method for tuning a radio frequency (RF) coil array for use in a magnetic resonance imaging (MRI) system includes coupling a first cable to a first RF coil and coupling a second cable to a second RF coil. The RF coils have a main body configured to at least one of transmit or receive RF energy at a select operating imaging frequency in connection with acquiring MRI image data for an MRI system. The method also includes coupling the first and second cables to a system interface. The method then positions a common ground point along lengths of the first and second cables. The method then forms a common ground loop having a select self-resonance frequency (SRF) that differs from the imaging frequency.

In certain embodiments, the RF energy includes a wavelength, and the location of the grounding point is based on the wavelength.

In certain embodiments, the grounding point is located at a distance approximately one-fourth of the wavelength extending from the main body loop of at least one of the first or second RF coils.

In certain embodiments, the main body loops of the first and second RF coils each include central portion extending approximately through a center of each respective main body loop. The first or second cables extend to and through the central portion of the respective main body loop.

In certain embodiments, the ground loop includes the first and second RF coils and the first and second cables. The select SRF of the ground loop is tuned by moving the grounding point along the lengths of the first and second cables.

In certain embodiments, the first and second cables include an impedance. The position of the grounding point along the length of the first and second cables is set to define a select impedance along the ground loop in connection with setting the select SRF.

In certain embodiments, the self-resonance frequency is less than the imaging frequency.

In certain embodiments, the imaging frequency is approximately 128 megahertz.

In certain embodiments, the first and second cables are arranged such that the first and second cables are approximately perpendicular to electric field lines generated by the main body loops of the first and second RF coils.

In certain embodiments, the first and second cables include an outer conductor, the outer conductors electrically coupled to one another to from the common ground connection.

DETAILED DESCRIPTION

Figure 1:
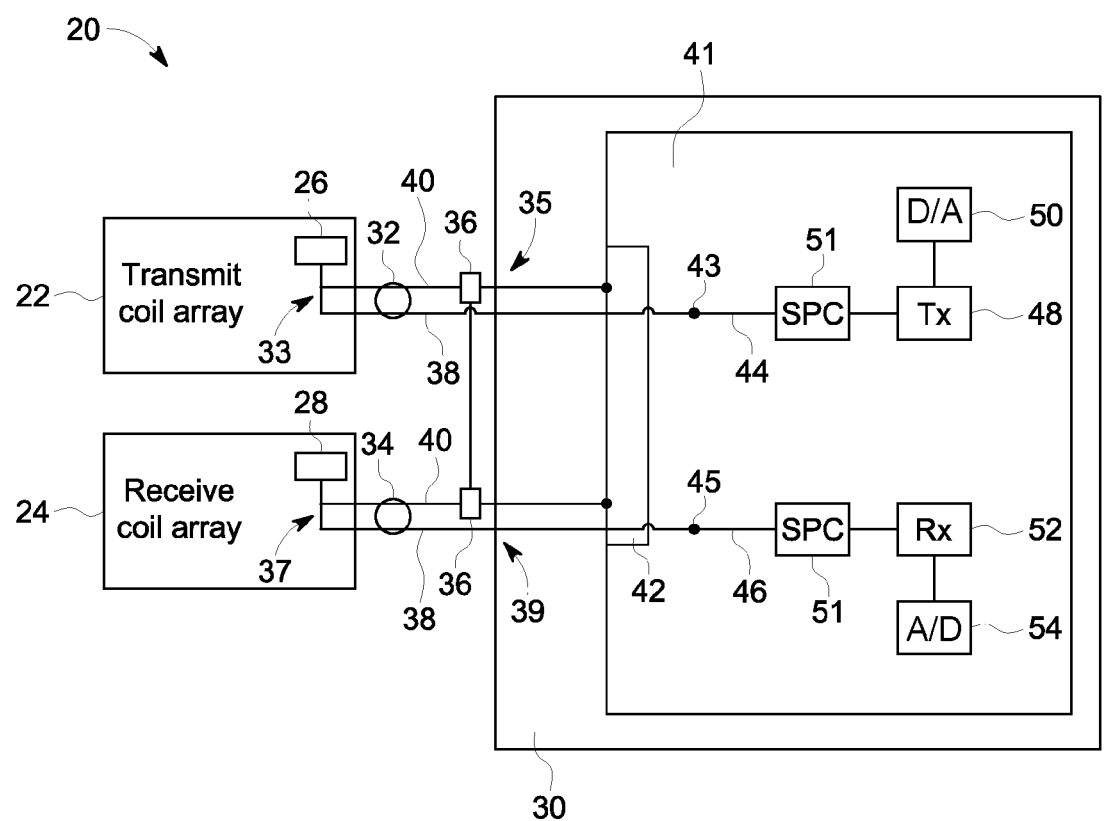
FIG. 1 is a block diagram of a transmit/receive section of a Magnetic Resonance Imaging (MRI) system having radio frequency (RF) coils in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments described herein provide systems and methods for arranging radio frequency (RF) coil arrays. The RF coil arrays have lead lines or coaxial cables that electrically couple RF coils to a system interface, for example, in a Magnetic Resonance Imaging (MRI) system. When stray capacitance is experienced between the RF coils, then the cables and RF coils combine to form a ground loop between adjacent cable pairs. The ground loop has a self-resonance frequency (SRF). A common ground plane, or common ground connection, is provided between the cables and is selectively located at a point along the length of the cables such that the SRF of the cables and RF coils differs from an operating imaging frequency of the MRI system. The ground plane couples the shields of the cables to one another, and is located at a point upstream of the system interface before drive ends of the cables are joined to electronics within the system interface. The location of the common ground plane may be based on characteristics of an RF signal transmitted and/or received by the RF coils. For example, in some embodiments, the common ground plane may be positioned along the cable at a select distance from one of the RF coils that corresponds to approximately one quarter of the wavelength of the RF signals. The cables are also centrally routed through a center of the RF coils to at least partially reduce electromagnetic interaction between the RF coils and cables.

As illustrated in FIG. 1, various embodiments may be implemented in connection with a transmit/receive section 20 of an MRI system. The transmit/receive section 20 is configured to acquire magnetic resonance (MR) image data using one or more coils or coil arrays, illustrated as a transmit coil array 22 and a receive coil array 24. The transmit coil array 22 includes first RF coil 26 and the receive coil array 24 includes a second RF coil 28. However, in various embodiments the transmit coil array 22 and the receive coil array 24 may include a plurality of RF coils. In various embodiments, one or both of the RF coils 26 and/or 28 may be configured to transmit and/or receive. In operation, the transmit coil array 22 is configured to transmit RF pulses and the receive coil array 24 is configured to detect or receive RF signals generated in response to the RF pulses, such as from a patient.

The transmit coil array 22 and receive coil array 24 are coupled to a system interface 30. One or more feed lines, or cables, are used to connect the transmit coil array 22 and receive coil array 24 to the system interface 30. The first and second cables 32 and 34 may be coaxial cables each having a signal conductor 38 circumferentially surrounded by a shield or outer conductor 40 (e.g., a cable braid). In the illustrated embodiment, a first cable 32 connects the transmit coil array 22 to the system interface 30. Similarly, a second cable 34 connects the receive coil array 24 to the system interface 30. The first cable 32 includes an interface end 33 that electrically couples to the RF coil 26 and a termination end 35 that electrically couples to the system interface 30. The second cable 34 includes an interface end 37 that electrically couples to the RF coil 28 and a termination end 39 that electrically couples to the system interface 30.

The various embodiments also include a common ground plane or connection 36 selectively positioned along a length of the cables 32 and 34. The common ground plane 36 electrically couples the first and second cables 32 and 34 to one another to form a common electrical ground. The common ground plane 36 may be formed by electrically joining the outer conductor 40 of the first cable 32 to the outer conductor 40 of the second cable 34. The common ground plane 36 is upstream of the termination ends 35 and 39 towards the interface ends 33 and 37, respectively. As such the common ground plane 36 is at an intermediate point along the lengths of the first and second cables 32 and 34. The common ground plane 36 is located away from the termination ends 35 and 39 such that the common ground plane 36 provides an electrical grounding point upstream of the system interface 30.

The system interface 30 includes a printed circuit board (PCB) 41 that includes various electrical components used to process signal information transmitted and/or received by the RF coil arrays 22 and 24. The termination ends 35 and 39 of the first and second cables 32 and 34, respectively, terminate at the system interface 30. The outer conductors 40 of the first and second cables 32 and 34 may be electrically and mechanically connected to a grounding pad 42. The grounding pad 42 electrically grounds the first and second cables 32 and 34 within the system interface 30. The grounding pad 42 is positioned within the system interface 30 and is downstream of the termination ends 35 and 39. The signal conductor 38 of the first cable 32 may terminate to a trace 44 on the PCB 41 at a contact point 43. The signal conductor 38 of the second cable 34 may terminate to a trace 46 on the PCB 41 at a contact point 45. The traces 44 and 46 may extend to various signal processing components 51 (SPC) mounted on the PCB 41. For example, the SPCs may include amplifiers, filters, and/or the like. The traces 44 and 46 may then extend to other electrical components for further processing. For example the trace 44 may continue downstream to a transmission module 48 and a digital to analog (D/A) converter 50. The trace 46 may continue downstream to a reception module 52 and an analog to digital (A/D) converter 54. In various embodiments, the PCB 41 may include other signal processing components and circuitry.

In operation, the system interface 30 transmits electrical signals, such as, for example, a signal current, to the transmit coil array 22 via the first cable 32. The first coil 26 in the transmit coil array 22 transmits RF energy as electromagnetic waves. The MRI system may be configured to be responsive to a select imaging frequency. For example, the imaging frequency may be approximately 128 MHz (e.g., the Larmor frequency). The electromagnetic waves also have a select wavelength. The wavelength may be any wavelength, such as, for example, 0.1 meter, 0.2 meters, 0.5 meters, and/or the like. The receive coil array 24 then detects electromagnetic waves transmitted through the patient, and converts the RF energy to electrical signals that are sent to the system interface 30 via the cable 34.

Figure 2A:
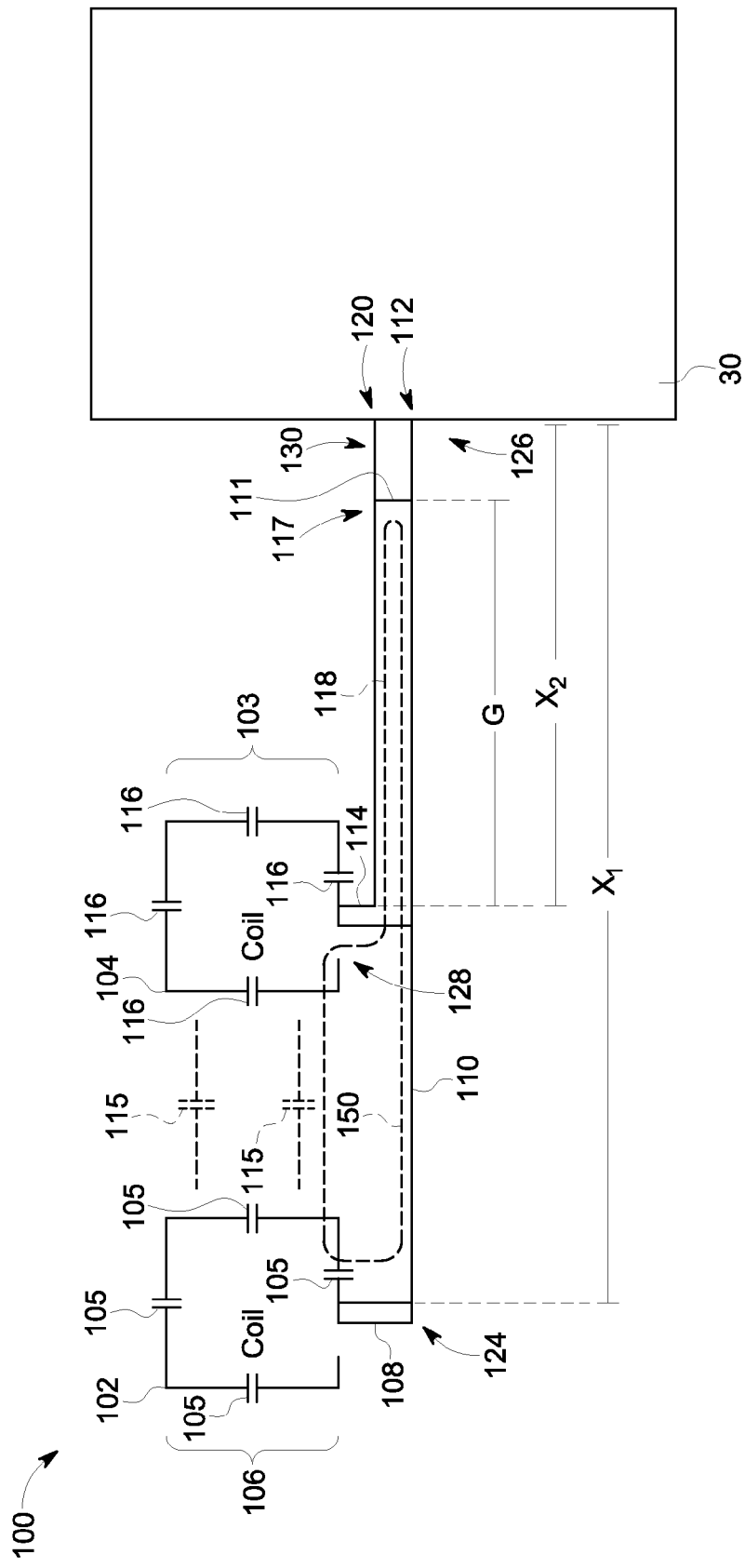
FIG. 2A is a diagram illustrating an RF coil array formed in accordance with an embodiment.

FIG. 2A is a diagram illustrating an RF coil array 100 array formed in accordance with an embodiment. In accordance with various embodiments, the RF coil array 100 may be configured as the transmit coil array 22 and/or the receive coil array 24 shown in FIG. 1.

The RF coil array 100 includes a first RF coil 102 and a second RF coil 104. The first RF coil 102 includes a main body loop 106 that forms a loop and terminates at a coil interface 108. In the illustrated embodiment, the main body loop 106 forms a rectangular open loop (e.g., a monopole). However, in other embodiments, other arrangements are possible, such as a closed loop, a circular loop, and/or the like. The main body loop 106 provides an electrical pathway and may be made of any electrically conductive material. A plurality of capacitive elements 105 are distributed along the conductive pathway of the main body loop 106 in series. An interface end 124 of a first cable 110 is coupled to the coil interface 108. The first cable 110 extends a length X1 between the coil interface 108 and the system interface 30. The first cable 110 terminates at a termination end 126 at system interface 30. The first cable 110 is electrically grounded at a common ground plane 111 that is selectively positioned at a grounding point 117 along the first cable 110, as is discussed below. The first cable 110 forms a channel 112 that electrically connects the main body loop 106 to the system interface 30 via the coil interface 108.

Similarly, the RF coil 104 includes a main body loop 113 that forms a loop and terminates at a coil interface 114. A plurality of capacitive elements 116 are distributed along the main body loop 113 in series. An interface end 128 of a second cable 118 is coupled to the coil interface 114. The second cable 118 is electrically grounded at the common ground plane 111 at the grounding point 117. The second cable 118 extends a length X2 between the coil interface 114 and the system interface 30. The second cable 118 terminates at a termination end 130 at the system interface 30. The second cable 118 forms a channel 120 that electrically connects the main body loop 113 to the system interface 30 via the coil interface 114.

The outer conductors of cables 110 and 118 are electrically coupled to one another at the grounding point 117. The grounding point 117 is spaced a select distance G from the coil interface 114 along at least one of the cables 110 and 118. As is discussed below, the distance G may be selected based on the wavelength of the RF energy transmitted by the RF coils 102 and 104.

In operation, the system interface 30 forces an alternating current (e.g., a signal current) through the cables 110 and 116. When the current is applied, an electric (E) field is developed along the cables 110 and 118, and in the main body loops 106 and 113. The proximity of the main body loops 106 and 113 to one another creates a mutual capacitance therebetween. For illustrative purposes, the mutual capacitive is shown as phantom capacitive elements 115. The proximity of the main body loops 106 and 113 allows a ground loop 150 (as denoted in dashed line) to form between the first and second cables 110 and 116. For example, the ground loop 150 may extend from the main body loop 106 of the first RF coil 102, to and through the coil interface 108, through the first first cable 110, through the common ground plane 111, through the second cable 118, to and through the coil interface 114, and through the main body loop 113.

The ground loop 150 exhibits an impedance, an inductance and a capacitance. For example, an impedance R may be sensed by the ground loop 150 along ground loop 150. The impedance R may be based on an impedance R1 developed along the first cable 110 between the interface end 124 and the common ground plane 111, an impedance R2 developed along the second cable 118 between the common ground plane 111 and the interface end 128, and impedance R3 developed between the main body loops 102 and 104. As another example, a capacitance C may be sensed by the ground loop 150. The capacitance C may be based on a capacitance C1 developed between the first and second cables 110 and 118 along the distance G, a capacitance C2 exhibited by the capacitive elements 116, the mutual capacitance C3 exhibited by the phantom capacitive elements 115, and a capacitance C4 developed by the capacitive elements 105. The ground loop 150 may also exhibit an inductance L. For example, the inductance L may be based on an inductance L1 developed along the first cable 110 between the interface end 124 and the common ground plane 111, an inductance L2 developed along the second cable 118 between the common ground plane 111 and the interface end 128, and an inductance L3 developed between the main body loops 102 and 104.

The ground loop 150 exhibits a self-resonance frequency (SRF) based on the inductance L, capacitance C, and/or the impedance R exhibited by the ground loop 150. The SRF may be selectively varied, or tuned, by moving the grounding point 117, and accordingly, the common ground connection 111, along the lengths of the cables 110 and 118. For example, the SRF may be inversely proportional to the impedance R, inductance L and the capacitance C. For example, as the impedance R in the ground loop 150 increases, the SRF may decrease (e.g., approach a lower frequency range). For example, by reducing the distance G, the size (e.g., length) of the ground loop 150 is reduced, and accordingly, the capacitance C1 exhibited by the ground loop 150 changes. As another example, changing the size of the ground loop 150 also changes the inductances L1 and L2. As yet another example, changing the size of the ground loop 150 also changes the impedances R1 and R2. In this manner, the SRF may be selectively tuned by varying the location of the grounding point 117.

In an exemplary embodiment, the SRF may be based on the RF energy transmitted by the first and/or second coils 102 and 104. As discussed above in relation to FIG. 1, the electromagnetic waves transmitted by RF coils include a wavelength and an imaging frequency. In an exemplary embodiment, the location of the grounding point 117 may be based on the wavelength of the electromagnetic waves. For example, the distance G may be based on the wavelength such that a select inductance L, capacitance C, or impedance R is achieved. For example, the location of the grounding point 117 at approximately one-fourth the wavelength may yield a select impedance R (e.g., maximum). As such, the impedance in the ground loop 150 increases as distance G approaches approximately one-fourth the wavelength. In this manner, the SRF of the ground loop 150 may be shifted to a lower frequency range.

Figure 2B:
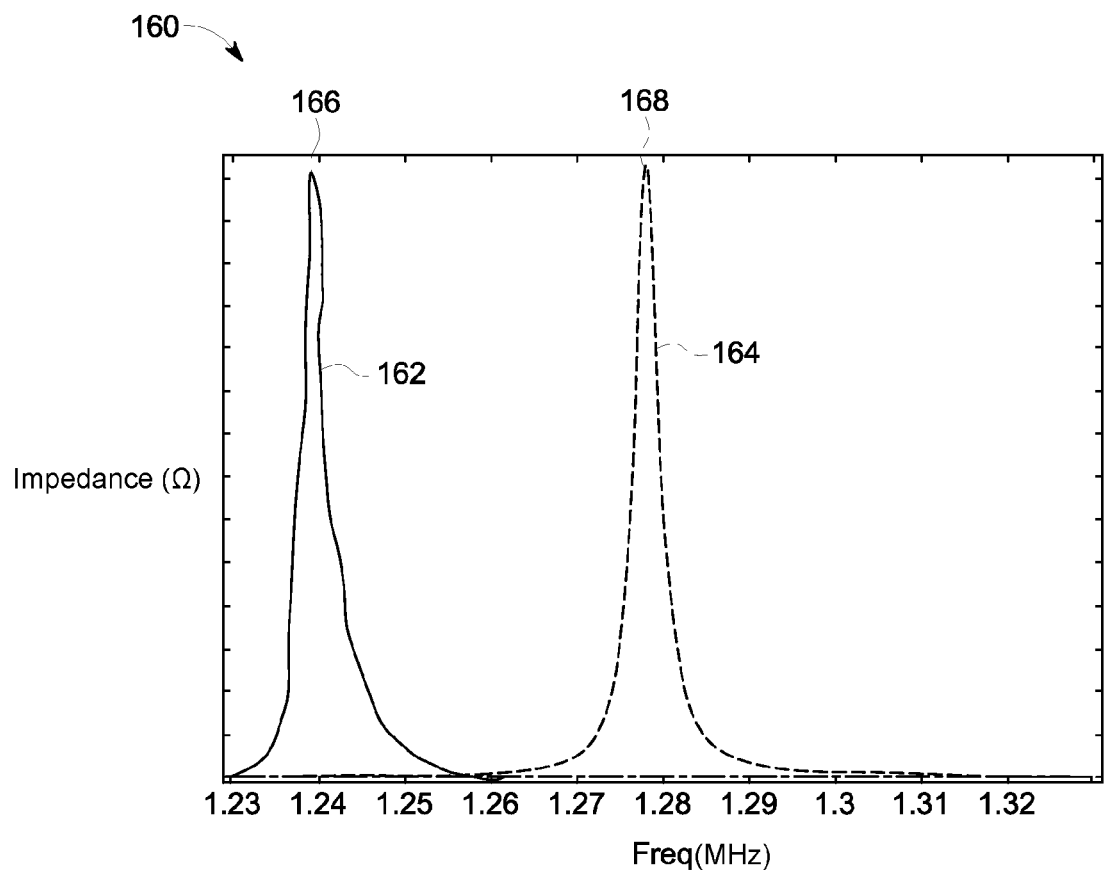
FIG. 2B is a graph illustrating a ground loop resonance curve and an imaging system resonance curve formed in accordance with an embodiment.

FIG. 2B, with continued reference to FIG. 2A, is a graph 160 illustrating a ground loop resonance curve 162 and an imaging system resonance curve 164 formed in accordance with an embodiment. The curves 162 and 164 are plotted as a function of frequency in Hertz and illustrate resonance peaks 166 and 168, respectively, at select frequencies. The ground loop resonance curve 162 represents the SRF exhibited by the ground loop 150. The imaging system resonance curve 164 represents the resonance frequency that the imaging system is tuned to. As illustrated, the peak 166 in the ground loop resonance curve 162 indicates that the ground loop 150 has an SRF at approximately 124 MHz and the peak 168 in the imaging system resonance curve 164 has a resonance frequency at approximately 128 MHz.

As the SRF of the ground loop 150 approaches the imaging frequency, the capacitive C, inductive L, and impedance R in the ground loop 150 may generate interference and/or signal loss in the first and second channels 112 and 120. The signal loss and interference may cause or alter the imaging frequency, and reduce the performance of the imaging system. The signal loss may be reduced (e.g., minimized) by selecting a SRF that differs from the imaging frequency. For example, the select SRF frequency may be less than the imaging frequency. As illustrated, the peak 166 in the ground loop resonance curve 162 is positioned at a frequency (124 Mhz) that is lower than a frequency of the peak 168 (128 Mhz).

Figure 3:
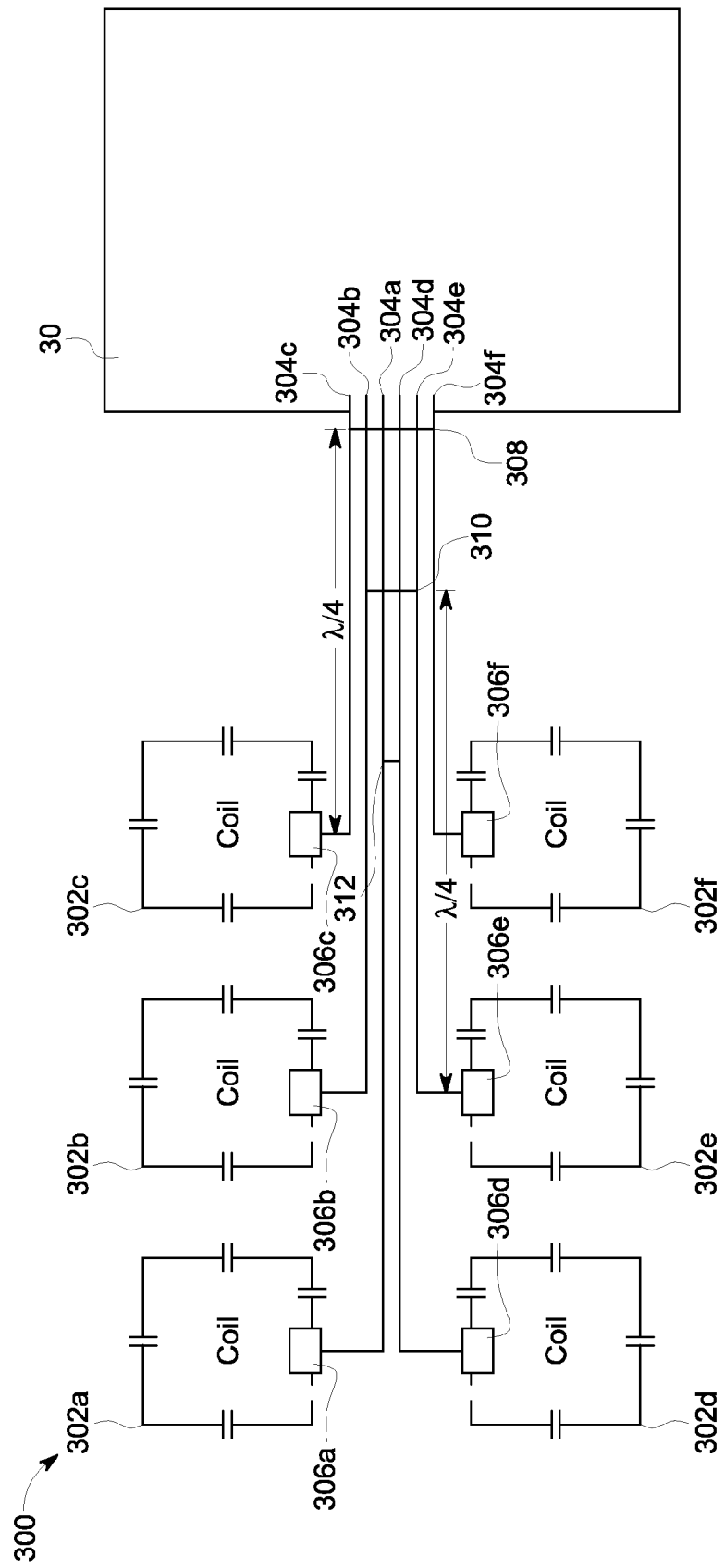
FIG. 3 is a diagram illustrating an RF coil array network formed in accordance with an embodiment.

FIG. 3 is a diagram illustrating an RF coil array network 300 formed in accordance with an embodiment. The coil array network 300 includes a plurality of RF coils 302 having corresponding cables 304 extending from respective cable interfaces 306 coupled to the RF coils 302. For example, the cable 304a extends from a cable interface 306a of the RF coil 302a. The RF coils 302 may be the RF coils 102 and/or 104 discussed above in relation to FIG. 2A.

The RF coil array network 300 may include one or more grounding connections such that each cable 304 is grounded at a distance no less than one-fourth of the wavelength. In the illustrated embodiment, each cable 304 includes a grounding connection approximately spaced apart every one-fourth wavelength. The grounding connection may be positioned at a grounding point that is based on the wavelength of the electromagnetic waves transmitted by the coils 302, as discussed above in relation to FIG. 2A.

For example, the each cable 304 may include a grounding connection positioned a distance approximately one-fourth of the wavelength from a respective cable interface. For example, a first grounding connection 308 electrically couples the cables 302a, 302b, 302c, 302d, and 302e to one another at a distance approximately one-fourth of the wavelength from the coil interfaces 306c and 306f (closest to the system interface 30). A second grounding connection 310 electrically couples the cables 304a, 304b, 304d, and 304e to one another at a distance approximately one-fourth of the wavelength from the coil interfaces 306b and 306e. A third grounding connection 312 electrically couples the cables 304a and 304d to one another at a distance approximately one-fourth of the wavelength from the coil interfaces 306a and 306d. In this manner, each cable 304 includes a grounding connection at no less than one-fourth of the wavelength from a corresponding coil interface 306.

Figure 4:
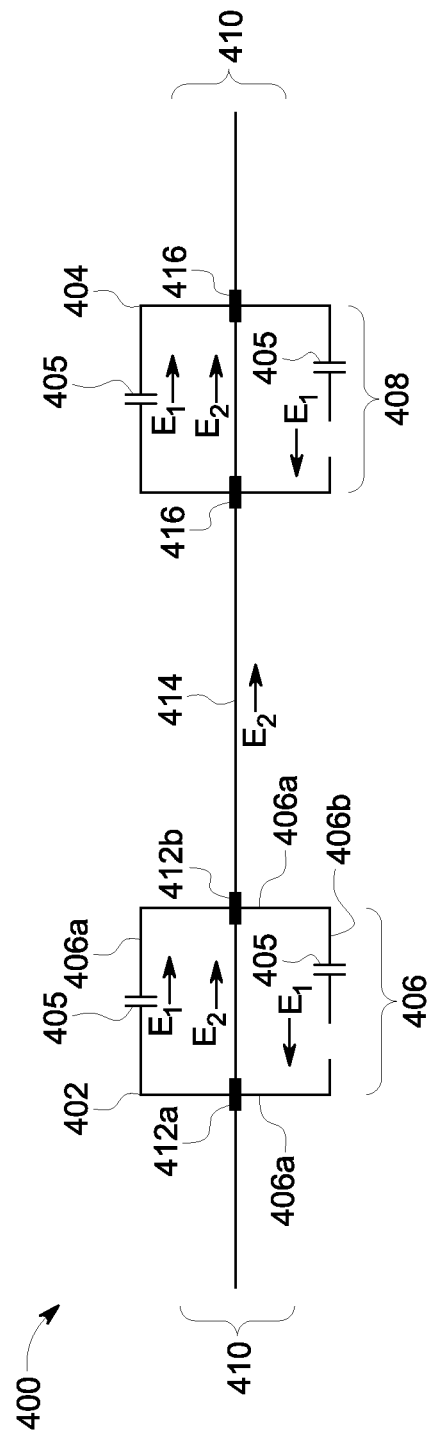
FIG. 4 is a diagram illustrating an RF coil array having centralized cables formed in accordance with an embodiment.

FIG. 4 is a diagram illustrating an RF coil array 400 having centralized cables formed in accordance with an embodiment. The RF coil array 400 includes a first RF coil 402 and a second RF coil 404. The first and second RF coils 402 and 404 may be the RF coils 102 and 104 as discussed above in relation to FIG. 2A.

The RF coils 402 and 404 include a main body loop 406 and 408, respectively. The main body loops 406 and 408 each include a central portion 410 extending substantially through the geometric center of the main body loops 406 and 408. For example, in the illustrated embodiment, the main body loop 406 is a rectangular loop having lateral sides 406a and 406b, and longitudinal sides 406c and 406d. The central portion 410 extends through the center of the 402c and 402d. It should be noted that in other embodiments, other shapes are possible, such as, a round shape. The main body loops 406 and 408 may include capacitive elements 405 electrically coupled therewith.

A cable interface 412 couples a cable 414 to and through the RF coil 402. Similarly, a cable interface 416 couples the cable 414 to and through the RF coil 404. In the illustrated embodiment the cable 414 is shown as a single cable, however, the cable 414 may include a plurality of cables individually coupling each of RF coils 402 and 404 to separate transmission lines. For example, the cable interface 412a may be configured as a bridge type interface such that the cable 414 does not electrically couple to the main body loop 406. Conversely, the cable interface 412b may electrically couple the main body loop 406 to a separate transmission line within the cable 414. In this manner, the cable 414 may include a plurality of transmission lines that couple individually respective RF coils. The cable 414 may electrically terminate at a system interface 30 (shown in FIG. 1).

In operation, a signal current flows through the cable 414 and RF coils 402 and 404. The signal current creates an electric field E that extends parallel to conductive elements of the main body loops 406 and 408 as indicated by the arrows E1. An electric field E is also generated along the cable 414 as indicated by the arrows E2. The electric field E extends along a length of the cable 414. Generally, the components of the electric fields E generated by the cable 414 that are parallel to sides of the main body loops 406 and 408 may interfere with the electric fields E generated within the RF coils 402 and 404. For example, the lateral sides 406a and 406b are generally parallel to a portion of the cable 414. Conversely, the longitudinal sides 406c and 406d are generally perpendicular to the cable 414. By locating or routing the cable 414 to and through the central portion 410, the cable 414 is substantially spaced apart from components of the main body loops 406 and 408 that are parallel to the cable 414. Accordingly, by selectively locating the cable 414 within the central portion 410, the interference effects of the parallel components of the electric fields E may be reduced (e.g., minimized).

Figure 5:
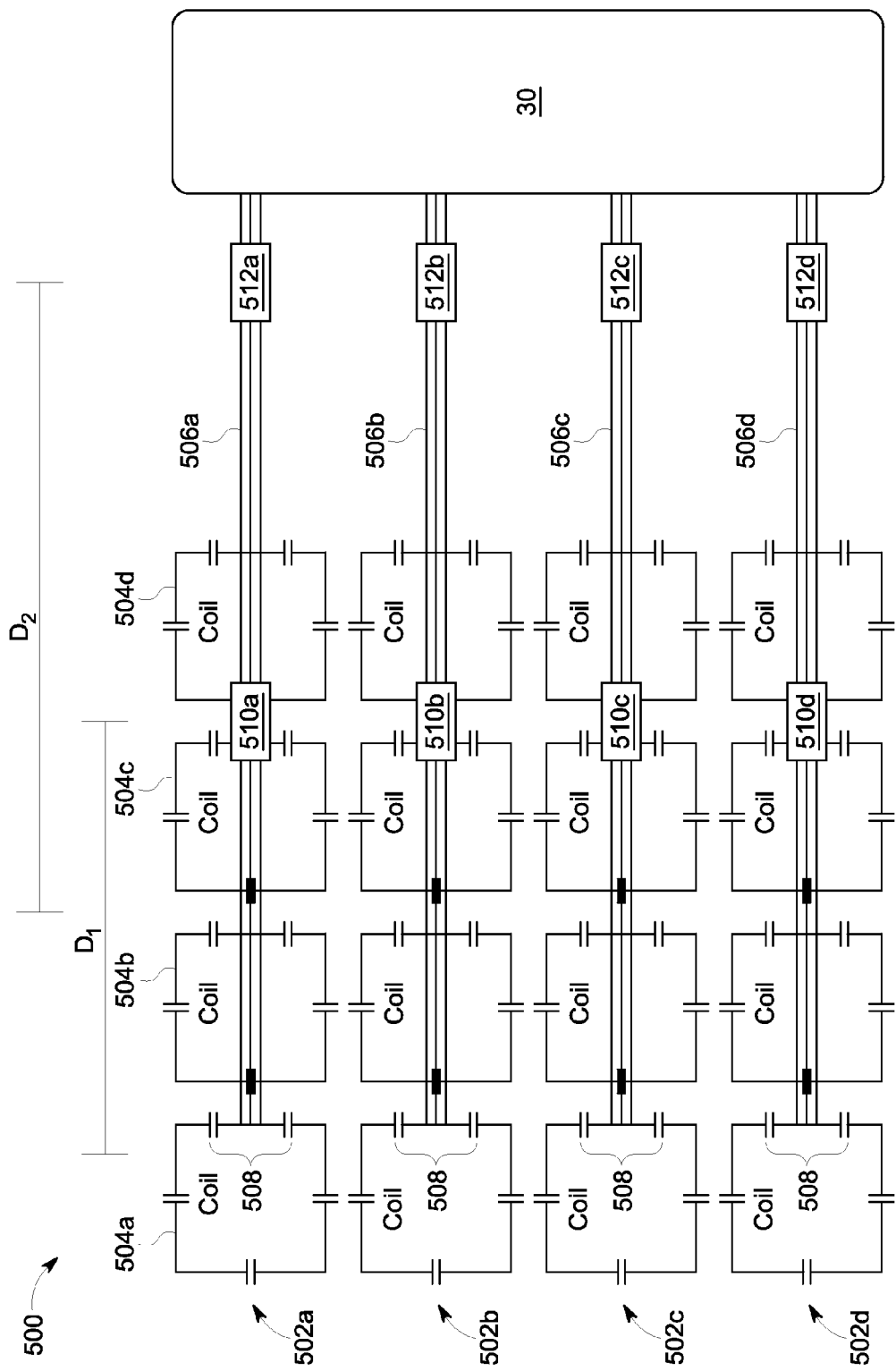
FIG. 5 is a diagram illustrating an RF coil network having centralized cables formed in accordance with an embodiment.

FIG. 5 is a diagram illustrating an RF coil network 500 having centralized cables formed in accordance with an embodiment. The RF coil network 500 includes a plurality of RF coil arrays 502a, 502b, 502c, and 502d. In the illustrated embodiment, the RF coil array 502a includes four RF coils 504a, 504b, 504c, and 504d. In other embodiments, the RF coil arrays 502 may include more or fewer RF coils 504. The RF coils 504 may be the RF coil 102 and/or the RF coil 104 shown in FIG. 2A.

Each of the RF coil arrays 502 include respective cables 506a, 506b, 506c, and 506d electrically coupling the RF coils 504 to the system interface 30. In the illustrated embodiment, the cables 506 are shown extending through every RF coil 502 in the respective RF coil arrays 502. For example, the cables 506a are shown extending to and through each of the RF coils 504 in the RF coil array 502a. However, the cable 506 may include individual transmission lines individually coupling each of the RF coils 504 to the system interface 30.

The cables 506 extend through a central portion 508 of each of the RF coils 504. As discussed above in relation to FIG. 4, centrally locating the cables 506 to and through the central portion 508 of each RF coil 504 may improve cable routing such that interference effects of electric fields generated in the cables 506 are reduced (e.g., minimized).

The cables 506 include a first set of common grounding connections 510a, 510b, 510c, and 510d along a length of the cables 506. The first set of common grounding connections 510 are selectively located along the length of the cables 506. For example, the first set of common grounding connections 510 may be located a distance D1 from the RF coil 504a. For example, the distance D1 may be approximately one-fourth of the wavelength of the RF energy transmitted/received by the RF coil 504a, as discussed above in relation to FIG. 2A.

The cables 506 may also include a second set of common grounding connections 512a, 512b, 512c, and 512d along a length of the cables 506. The second set of common grounding connection 512 are also selectively located along the length of the cables 506. For example, the second set of common grounding connections 512 may be located a distance D2 from the RF coil 504b. For example, the distance D2 may be approximately one-fourth of the wavelength of the RF energy transmitted/received by the RF coil 504b.

The RF coil arrays 502 may include more or fewer common grounding connections such that each of the cables 506 is electrically grounded at a distance approximately one-fourth of the wavelength.

Figure 6:
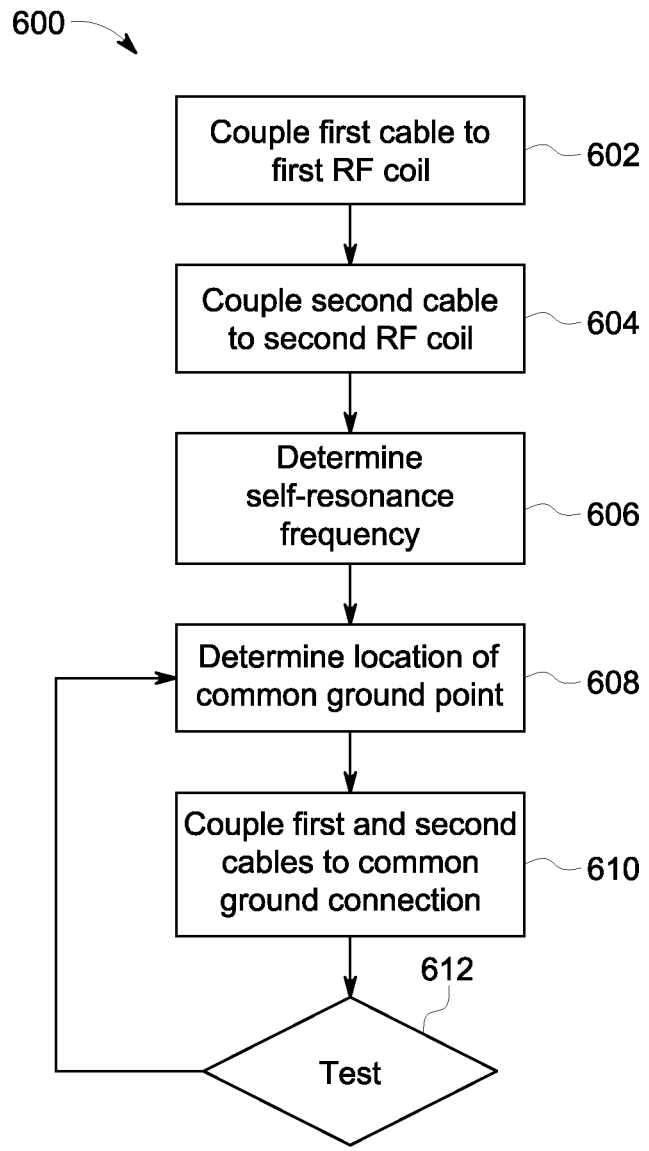
FIG. 6 is a flowchart of a method for arranging cables of RF coil arrays in accordance with various embodiments.

FIG. 6 is a flowchart of a method 600 for arranging RF coil arrays formed in accordance with various embodiments. The method 600 may be used with a medical imaging system, such as the medical imaging system 200 shown in FIG. 7.

At 602, a first cable is coupled to a first RF coil. The first RF coil is configured to at least one of transmit or receive RF energy at a select imaging frequency. Optionally, the first RF coil may be tuned to an imaging frequency of approximately 128 megahertz. Optionally, the first cable may be arranged such that the first cable extends through a central portion of the first RF coil. Optionally, the first cable may be arranged such that the first cable is substantially spaced apart from components of the first RF coil that are parallel to the first cable.

At 604, a second cable is coupled to a second RF coil. The second RF coil is configured to at least one of transmit or receive RF energy at the select imaging frequency. Optionally, the first RF coil may be tuned to an imaging frequency of approximately 128 megahertz. Optionally, the second cable may be arranged such that the second cable extends through a central portion of the second RF coil. Optionally, the second cable may be arranged such that the second cable is substantially spaced apart from components of the second RF coil that are parallel to the second cable.

Optionally, at 606 a self-resonance frequency of the first and cables is determined. The self-resonance frequency may be formed by a ground loop formed between the first and second cables. For example, a mutual inductance, a mutual capacitance, and/or an impedance may be developed in the ground loop such that the ground loop exhibits a self-resonance when electrical energy is applied through the first and second cables.

At 608, a location of a common ground connection is selectively positioned at a common ground point along the lengths of the first and second cables. The common ground point may be based on a wavelength of the select imaging frequency. For example, the common ground point may be positioned a distance approximately one-fourth of the wavelength from a main body loop of at least one of the first or the second RF coils. Optionally, the location of the common ground point may be based on the self-resonance frequency such that the location of the common ground point causes the self-resonance frequency to be less than the imagining frequency.

At 610, the first cable and the second cable are coupled to a common ground connection positioned at the common ground point. The common ground connection forms a ground loop having the select self-resonance frequency that differs from the imaging frequency. The common ground connection may couple the first and second cables to one another such that an outer conductor of the first cable and an outer conductor of the second cable are electrically coupled to one another.

Optionally at 612, the self-resonance frequency of the first and second cables may be tested, estimated, or measured. For example, an impedance along a length of the first and second cables may be measured to estimate the self-resonance frequency. If the self-resonance frequency of the first and second cables is sufficiently different from the imaging frequency, then the method may end. For example, the self-resonance frequency may less than a predetermined threshold from the imaging frequency. Otherwise, the method may return to 608 to determine and/or adjust the location of the common ground point. The process may then be repeated iteratively until the self-resonance frequency sufficiently differs from the imaging frequency.

Figure 7:
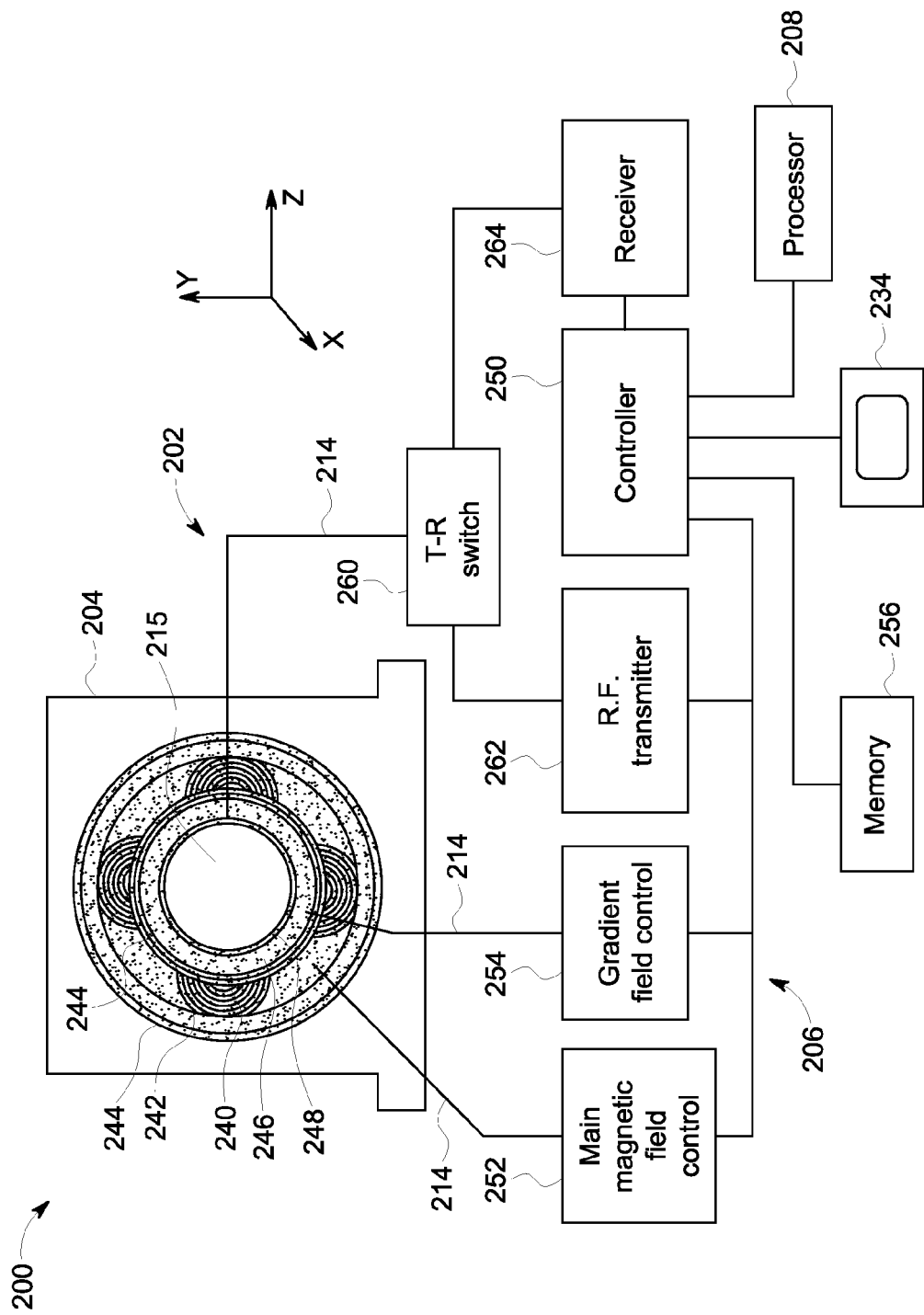
FIG. 7 is a schematic illustration of an exemplary medical imaging system in which various embodiments may be implemented.

FIG. 7 is a schematic illustration of an exemplary medical imaging system in which various embodiments may be implemented. Various embodiments of an RF coil may be provided as part of, or used with, a medical imaging system, such as the magnetic resonance imaging system 200. It should be appreciated that although the imaging system 200 is illustrated as a single modality imaging system, the various embodiments may be implemented in or with multi-modality imaging systems. The imaging system 200 is illustrated as an MRI imaging system. Moreover, the various embodiments are not limited to medical imaging systems for imaging human subjects, but may include veterinary or non-medical systems for imaging non-human objects, luggage, etc.

The imaging system 200 includes an imaging portion 202 having an imaging unit 204 (e.g., imaging scanner) and a processing portion 206 that may include a processor 208 or other computing or controller device. In particular, the imaging unit 204 enables the imaging system 200 to scan an object or patient to acquire image data, which may be image data of all or a portion of the object or patient. The imaging unit 204 includes one or more imaging components that allow acquisition of image data. The imaging components produce signals that represent image data that is communicated to the processing portion 206 via one or communication links 214 that may be wired or wireless. The patient may be positioned within a bore 215 using, for example, a motorized table and then MR imaging performed as described in more detail herein.

In operation, an output of one or more of the imaging components is transmitted to the processing portion 206, and vice versa, which may include transmitting signals to or from the processor through a control interface 220, which may be embodied as the system interface 30 (shown in FIG. 1). The processor 208 also may generate control signals for controlling the position of the motorized table and imaging components based on user inputs or a predetermined scan. For example, RF signals or transmit pulses may be communicated through the one or more communication links 214, which may include one or more RF traps as described herein.

During a scan, image data, such as magnetic resonance image data from the imaging components may be communicated to the processor 208 through a data interface via the control interface, for example, as acquired by a body coil or surface coil.

The processor 208 and associated hardware and software used to acquire and process data may be collectively referred to as a workstation. The workstation may include, for example, a keyboard and/or other input devices such as a mouse, a pointer, and the like, and a monitor 234. The monitor 234 displays image data and may accept input from a user if a touchscreen is available.

In the exemplary embodiment, the imaging system 200 also includes a superconducting magnet 240 formed from magnetic coils supported on a magnet coil support structure. However, in other embodiments, different types of magnets may be used, such as permanent magnets or electromagnets. A vessel 242 (also referred to as a cryostat) surrounds the superconducting magnet 240 and is filled with liquid helium to cool the coils of the superconducting magnet 240. A thermal insulation 244 is provided surrounding the outer surface of the vessel 242 and the inner surface of the superconducting magnet 240. A plurality of magnetic gradient coils 246 are provided within the superconducting magnet 240 and an RF transmit coil 248 (which may be embodied as the transmit coil 26) is provided within the plurality of magnetic gradient coils 146. In some embodiments the RF transmit coil 248 may operate as a receive coil. It should be noted that although the superconducting magnet 240 is a cylindrical shape, other shapes of magnets can be used. In various embodiments described herein, the gradient coils 246 and/or the RF transmit coil 248 may be embodied as the RF coils described in relation to FIG. 1.

The processing portion 206 also generally includes a controller 250, a main magnetic field control 252, a gradient field control 254, a memory 256, the display device 234, a transmit-receive (T-R) switch 260, an RF transmitter 262 and a receiver 264.

In operation, a body of an object, such as the patient or a phantom to be imaged, is placed in the bore 215 on a suitable support, for example, a motorized table or other patient table. The superconducting magnet 240 produces a uniform and static main magnetic field $B_o$ across the bore 215. The strength of the electromagnetic field in the bore 215 and correspondingly in the patient, is controlled by the controller 250 via the main magnetic field control 252, which also controls a supply of energizing current to the superconducting magnet 240.

The magnetic gradient coils 246, which include one or more gradient coil elements, are provided so that a magnetic gradient can be imposed on the magnetic field $B_o$ in the bore 215 within the superconducting magnet 240 in any one or more of three orthogonal directions x, y, and z. The magnetic gradient coils 246 are energized by the gradient field control 254 and are also controlled by the controller 250.

The RF transmit coil 248 is arranged to transmit RF magnetic pulses and/or optionally detect MR signals from the patient if receive coil elements are not provided on the patient. In various other embodiments, the receive coil arrays 24 (shown in FIG. 1) detect the MR signals. The RF transmit coil 248/or receive coil arrays 24 are selectably interconnected to one of the RF transmitter 262 or receiver 264, respectively, by the T-R switch 260. The RF transmitter 262 and T-R switch 260 are controlled by the controller 250 such that RF field pulses or signals that are generated by the RF transmitter 262 are selectively applied to the patient for excitation of magnetic resonance in the patient.

Following application of the RF pulses, the T-R switch 260 is again actuated to decouple the RF transmit coil 248 from the RF transmitter 262. The detected MR signals are in turn communicated to the controller 250. The controller 250 includes a processor (e.g., image reconstruction processor), for example the processor 208, that controls the processing of the MR signals to produce signals representative of an image of the patient.

The processed signals representative of the image are also transmitted to the display device 234 to provide a visual display of the image. Specifically, the MR signals fill or form a k-space that is Fourier transformed to obtain a viewable image. The processed signals representative of the image are then transmitted to the display device 234.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A radio frequency (RF) coil array for use in a magnetic resonance imaging (MRI) system, the RF coil array comprising:
    at least first and second RF coils, each having a main body loop configured to at least one of transmit or receive RF energy at an operating imaging frequency in connection with acquiring MRI image data for the MRI system;
    first and second cables configured to electrically couple the first and second RF coils, respectively, to a system interface; and
    a common ground connection between the first and second cables having selectively positioned at a grounding point along lengths of the first and second cables to form a ground loop having a select self-resonance frequency (SRF) that differs from the imaging frequency of the MRI system.

2. The RF coil array of claim 1, wherein the RF energy includes a wavelength, the location of the grounding point based on the wavelength.

3. The RF coil array of claim 2, wherein the grounding point is located at a distance one-fourth of the wavelength extending from the main body loop of at least one of the first or the second RF coils.

4. The RF coil array of claim 1, wherein the main body loops of the first and second RF coils each include a central portion extending through a center of each respective main body loop, the first or second cables extending to and through the central portion of the respective main body loop.

5. The RF coil of claim 1, wherein the ground loop includes the first and second RF coils and the first and second cables, the select SRF of the ground loop being tuned by moving the grounding point along the lengths of the first and second cables.

6. The RF coil array of claim 1, wherein the first and second cables include an impedance, the position of the grounding point along the length of the first and second cables being set to define a select impedance along the ground loop in connection with setting the select SRF.

7. The RF coil array of claim 1, wherein the self-resonance frequency is less than the imaging frequency.

8. The RF coil array of claim 1, wherein the imaging frequency is 128 megahertz.

9. The RF coil array of claim 1, wherein the first and second cables are arranged such that the first and second cables are perpendicular to electric field lines generated by the main body loops of the first and second RF coils.

10. The RF coil array of claim 1, wherein the first and second cables include an outer conductor, the outer conductors electrically coupled to one another to from the common ground connection.

11. A method for tuning a radio frequency (RF) coil array for use in a magnetic resonance imaging (MRI) system comprising:
    coupling a first cable to a first RF coil and a second cable to a second RF coil, the first and second RF coils having a main body loop configured to at least one of transmit or receive RF energy at an operating imaging frequency in connection with acquiring MRI image data for the MRI system;
    coupling the first and second cables to a system interface;
    positioning a common ground point along lengths of the first and second cables; and
    forming a ground loop having a select self-resonance frequency (SRF) that differs from the imaging frequency of the MRI system.

12. The method of claim 11, wherein the RF energy includes a wavelength, the location of the grounding point based on the wavelength.

13. The method of claim 12, wherein the grounding point is located at a distance one-fourth of the wavelength extending from the main body loop of at least one of the first or the second RF coils.

14. The method of claim 13, wherein the main body loops of the first and second RF coils each include a central portion extending through a center of each respective main body loop, the first or second cables extending to and through the central portion of the respective main body loop.

15. The method of claim 11, wherein the ground loop includes the first and second RF coils and the first and second cables, the select SRF of the ground loop being tuned by moving the grounding point along the lengths of the first and second cables.

16. The method of claim 11, wherein the first and second cables include an impedance, the position of the grounding point along the length of the first and second cables being set to define a select impedance along the ground loop in connection with setting the select SRF.

17. The method of claim 11, wherein the location of the common ground point is selected such that the self-resonance frequency is less than the imaging frequency.

18. The method of claim 11, wherein the imaging frequency is 128 megahertz.

19. The method of claim 11, wherein the first and second cables are arranged such that the first and second cables are perpendicular to electric field lines generated by the main body loops of the first and second RF coils.

20. The method of claim 11, wherein the first and second cables include an outer conductor, the outer conductors electrically coupled to one another to from the common ground connection.

* * * * *